United States Patent [19]

Brady et al.

[11] Patent Number: 5,066,615

[45] Date of Patent: Nov. 19, 1991

[54] PHOTOLITHOGRAPHIC PROCESSES USING THIN COATINGS OF REFRACTORY METAL SILICON NITRIDES AS ANTIREFLECTION LAYERS

[75] Inventors: Michael F. Brady, Morrisville; John K. Dorey, II, Fairless Hills, both of Pa.; Aubrey L. Helms, Jr., Sunnyvale, Calif.

[73] Assignee: AT&T Bell Laboratories, Murray Hill, N.J.

[21] Appl. No.: 562,874

[22] Filed: Aug. 6, 1990

Related U.S. Application Data

[63] Continuation-in-part of Ser. No. 425,134, Oct. 23, 1989.

[51] Int. Cl.$^5$ .................... H01L 21/00; H01L 21/02; H01L 21/88
[52] U.S. Cl. .................... 437/229; 437/225; 437/228; 148/DIG. 137; 430/275; 430/276; 430/311; 430/313
[58] Field of Search ............... 437/225, 228, 229, 196, 437/197, 200; 148/DIG. 137, DIG. 147; 430/270, 275, 276, 311, 312, 313

[56] References Cited

U.S. PATENT DOCUMENTS

| | | | |
|---|---|---|---|
| 4,398,341 | 8/1983 | Geipel, Jr. et al. | 29/578 |
| 4,510,178 | 4/1985 | Paulson et al. | 437/918 |
| 4,640,001 | 2/1987 | Koiwai et al. | 29/572 |
| 4,760,369 | 7/1988 | Tiku | 437/8 |
| 4,820,611 | 4/1989 | Arnold, III et al. | 430/271 |
| 4,981,550 | 1/1991 | Huttemann et al. | 156/643 |

FOREIGN PATENT DOCUMENTS 0089355 4/1987 Japan.
0287001 11/1988 Japan.

OTHER PUBLICATIONS

"Fundamentals of Sputtering", by A. J. Aronson, *Microelectronic Manufacturing and Testing*, Jan. 1987, Part I, pp. 22-23, Part II, pp. 27-28.

"Antireflection Coatings on Metal Layers for Photolithographic Purposes", by H. A. M. van den Berg et al., *Journal of Applied Physics*, vol. 50, No. 3, Mar. 1979, pp. 1212-1214.

"Sputtered Metallizations for Hybrid Devices", by R. P. Maniscalco et al., *Hybrid Circuit Technology*, Sep. 1984, pp. 19-23.

"Reactive Sputter Deposition: A Quantitative Analysis", by D. K. Hohne et al., *Thin Solid Films*, Elsevier Sequoia, vol. 118 (1984), pp. 301-310.

Nakamura, A., Films Resists, Chemical Abstracts, CA104(10):73434v, 1985.

*Primary Examiner*—Brian E. Hearn
*Assistant Examiner*—B. Everhart
*Attorney, Agent, or Firm*—R. B. Anderson

[57] ABSTRACT

An antireflection coating (21) for use in integrated circuit processing consists of a film of x-silicon-nitride, where x is a metal from the group consisting of titanium, vanadium, chromium, zirconium, niobium, molybdenum, hafnium, tantalum and tungsten. These coatings are preferably made by sputtering, with the x silicon nitride coating being made by sputtering in a nitrogen-containing atmosphere.

21 Claims, 4 Drawing Sheets

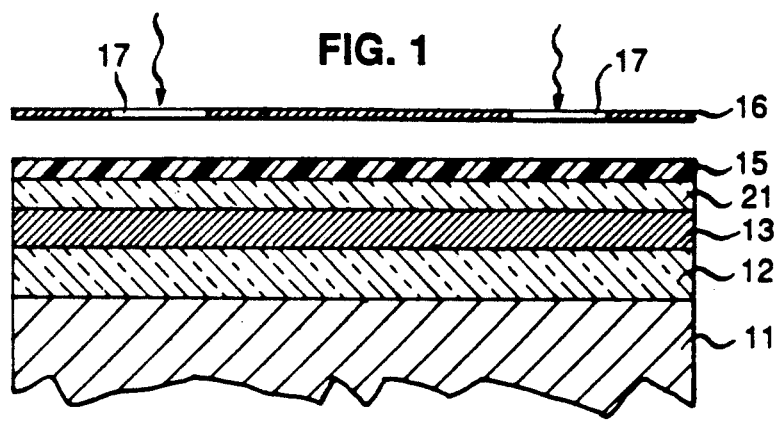
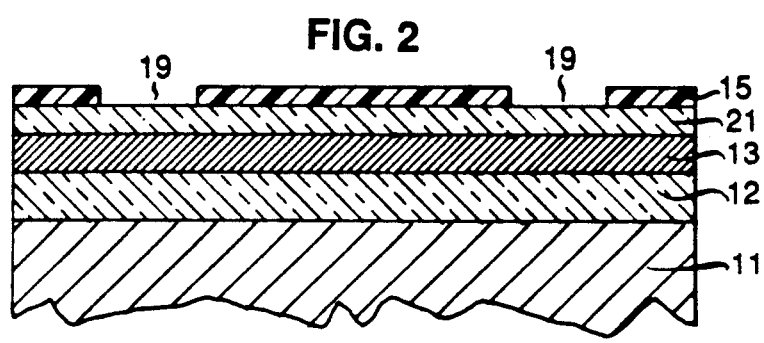
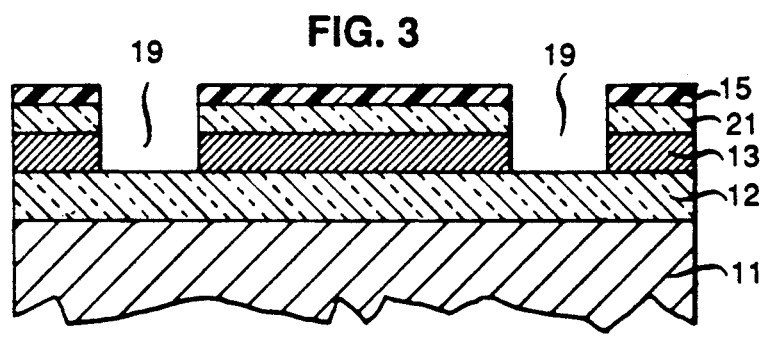
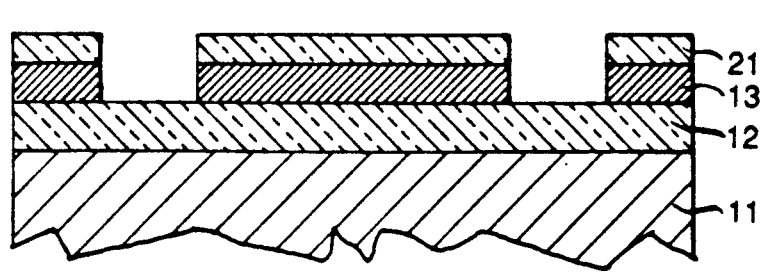

PHOTOLITHOGRAPHIC PROCESSES USING THIN COATINGS OF REFRACTORY METAL SILICON NITRIDES AS ANTIREFLECTION LAYERS

This is a Continuation-In-Part of M. F. Brady and A. L. Helms, Jr. Case 1-1, Ser. No. 425,134, filed Oct. 23, 1989.

TECHNICAL FIELD

This invention relates to thin coatings and, more particularly, to antireflection coatings used in photolithographic processes for making circuit patterns.

BACKGROUND OF THE INVENTION

One step in the fabrication of semiconductor integrated circuits is the formation of a conductor pattern over a semiconductor substrate through photolithographic masking and etching. This step typically requires the formation of a continuous sheet of metal film that is insulated from the substrate by a dielectric layer. A photoresist coating over the metal layer is selectively exposed to actinic light through a mask which defines the desired conductor pattern. The photoresist film is developed so that it in turn constitutes a mask having openings defining the desired conductor pattern. Modern integrated circuit techniques then often employ reactive ion etching for selectively etching away the exposed metal to the dielectric layer, and, after that, removal of the remaining photoresist leaves the desired conductor pattern overlying the dielectric layer.

Trends toward increased circuit density require a higher degree of control of the photolithographic processes to meet more stringent requirements for conductor pattern definition. Spurious reflection of the actinic light from the metal film has a tendency to blur the edges of the patterns being defined. A dyed photoresist can be used to reduce the effects of such reflections, but such compositions are dependent on thickness, shelf life and formulation, and thus do not give dependably uniform results. It has therefore been recognized that a separate antireflection coating should often be included between the metal layer and the photoresist film in integrated circuits made to a high degree of precision.

Various compositions that have been proposed for use as photolithographic antireflection coatings include titanium nitride, titanium-tungsten, silicon nitride and amorphous silicon. We have found that, particularly for use with gallium arsenide integrated circuits using aluminum conductors, these various known antireflection coatings have distint drawbacks. For example, titanium nitride has a very high stress when coated on aluminum, which may result in adhesion problems and other problems. Silicon coatings tend to react with aluminum and have antireflection properties that are highly dependent on thickness. There is, therefore, a well understood need in the industry for an antireflection coating that is robust in the sense that extreme care in controlling its characteristics need not be made, is chemically consistent with the use of metals such as aluminum and with subsequent device processing steps such as reactive ion etching, is able to adhere well to materials such as aluminum, and whose use is consistent with other processing requirements for making integrated circuits, especially gallium arsenide intergrated circuits.

SUMMARY OF THE INVENTION

In accordance with the invention, many advantages and benefits are obtained by using a metal-silicon-nitride composition as the antireflection coating. This coating is preferably formed by sputtering from a metal silicide target in a nitrogen-containing atmosphere. The metal is preferably one of the group consisting of titanium, vanadium, chromium, zirconium, niobium, molybdenum, hafnium, tantalum and tungsten. Either a metal silicide or separate metal and silicon targets can be used for the sputtering.

These and other features, advantages and benefits of the invention will be better understood from a consideration of the following detailed description taken in conjunction with the accompanying drawing.

BRIEF DESCRIPTION OF THE DRAWING

FIGS. 1-4 illustrate successive steps in an illustrative semiconductor photolithographic process in which the invention is used;

DETAILED DESCRIPTION

Figure 5:
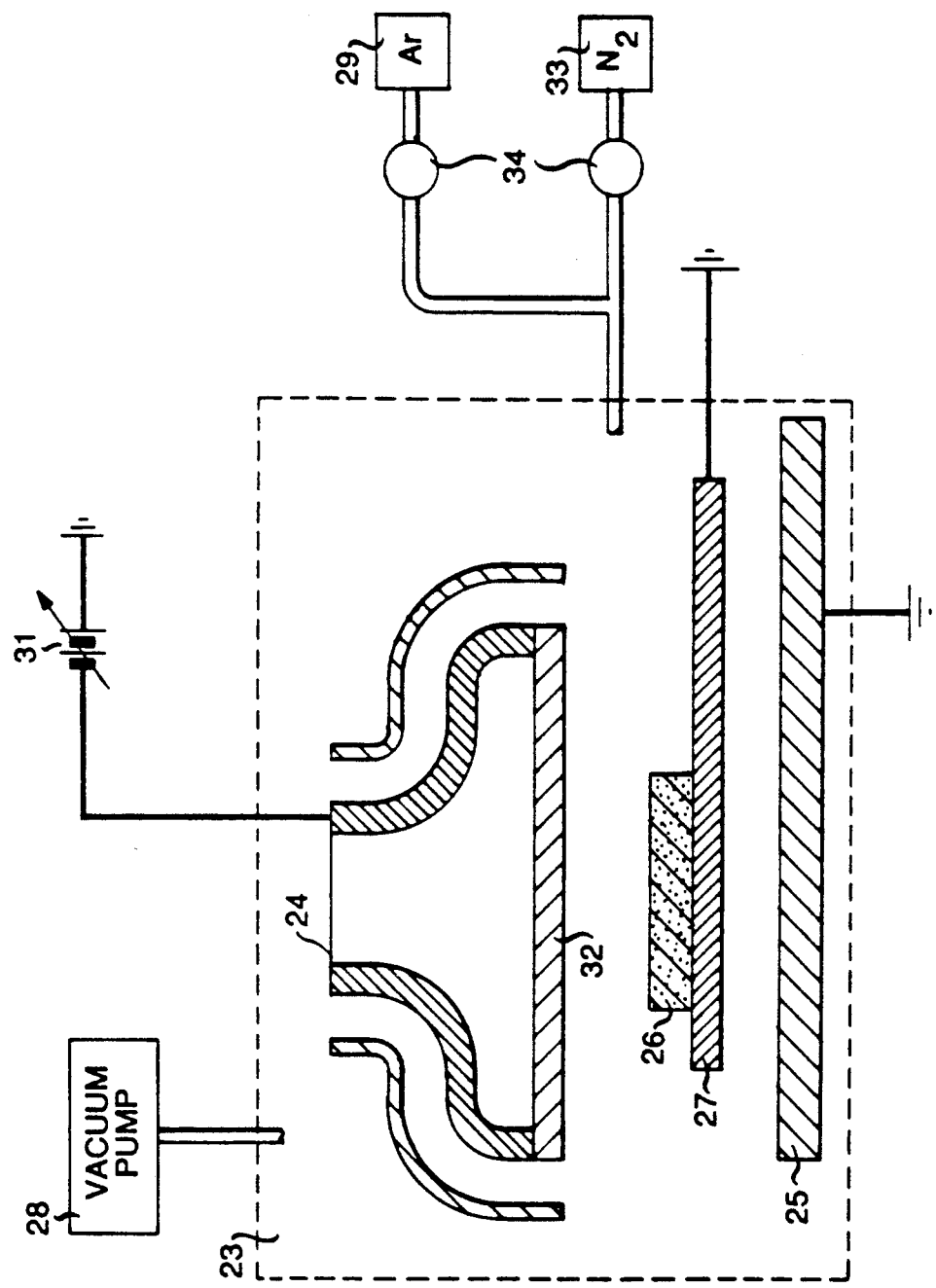
FIG. 5 is a schematic view of sputtering apparatus for depositing an antireflection coating in accordance with one embodiment of the invention.

Referring now to FIG. 1, there is shown schematically, and not to scale, a semiconductor substrate 11, which may typically be gallium arsenide, upon which it is desired to fabricate an integrated circuit through the use of known photolithographic processes. Overlying the semiconductor substrate is a layer 12 of a dielectric such as silicon oxynitride. Overlying the dielectric layer is a layer of metal such as aluminum from which it is desired to form a conductive pattern. Overlying the metal layer is a layer 15 that is sensitive to actinic light, typically an organic material known as a photoresist. A pattern in the photoresist layer is formed by selectively exposing it to actinic light, indicated schematically by the arrows, through a patterned photomask 16 containing openings 17.

After photographic exposure, the photoresist layer 15 is developed, typically by etching away regions that have been exposed to actinic light, and curing it to leave a final pattern defined by photoresist layer 15 having openings 19 as shown in FIG. 2. The accuracy of the photolithographic process requires that the openings 19 of the photoresist layer 15 of FIG. 2 correspond as closely as possible to the openings 17 in the photomask 16 of FIG. 1. The metal layer 13 of FIG. 1 is typically fairly highly reflective, and, as a consequence, light can be reflected from its surface so as to give spurious exposure of portions of photoresist layer 15. This can have the effect of blurring the edges of the openings 19 of FIG. 2 or may result in the regions of the photoresist mask being etched away that have no correspondence to the openings in the photomask. To overcome this problem, it is known in the prior art to include between the metal layer 13 and the photoresist layer 15 an antireflection coating 21, as shown in FIG. 1. It is normally important that such coating have a low reflectivity, be of a material that adheres well to metal layer 13, is appropriately nonreactive, and has characteristics consistent with the processing steps to which it is subjected.

Referring to FIG. 3, the photoresist layer 15 may typically be used as an etch mask which permits etching of the antireflection coating 21 and the metal layer 13 only in regions corresponding to the openings 19. Known reactive ion etch techniques, for example, can be used to selectively etch aluminum without appreciably etching the dielectric layer 12 of silicon oxynitride. After the conductive pattern has been defined in this manner, the photoresist coating 15 is normally etched away so as to leave the structure shown in FIG. 4. It is customary in the prior art also to remove the antireflection coating 21, but, as will be explained later, it may be convenient in accordance with the invention to leave the patterned antireflection coating intact.

In accordance with the invention, the antireflection coating 21 is a thin layer of metal-silicon-nitride, the metal being selected from the group consisting of titanium, vanadium, chromium, zirconium, niobium, molybdenum, hafnium, tantalum and tungsten. This layer is preferably deposited by sputtering using known apparatus such as that schematically shown in FIG. 5 FIG. 5 shows schematically a sputtering reactor 23 comprising a cathode 24 and an anode 25. A substrate 26 to be coated is supported by a support structure 27 that is kept at the anode potential. The reactor is evacuated by a vacuum pump 28 and a controlled amount of argon from a source 29 is controllably introduced into the reactor. The cathode is excited by a direct-current (DC) source 31 which creates a plasma between the anode and cathode electrodes. As is known, a radio-frequency (RF) source can alternatively be used. Facing the substrate 26 and at the cathode potential is a target 32 of the material which one desires to deposit. With a low pressure of argon, for example 25.0 microns of mercury, an appropriate DC power will cause positive argon ions to impact the target 32 thereby scatterring target material which is coated on the substrate 26. A more complete discussion of modern sputtering techniques are described in the paper "Fundamentals of Sputtering," by A. J. Aronson, Microelectronic Manufacturing and Testing, January, 1987, pages 22 and 23 and the paper "Sputtered Metalizations for Hybrid Devices," by R. L. Maniscalco et al., Hybrid Circuit Technology, September, 1984, pages 19-23. "Sputtering" is well understood in the art to mean deposition from a plasma due to particle impact on a target, and that is the meaning as used herein.

In accordance with one embodiment of the invention, the target 32 is made of tungsten silicide and nitrogen from a source 33 is mixed with the argon and injected into the reactor to give a plasma comprising both argon and nitrogen. This results in the deposition of an antireflection coating 21 on substrate 26 of tungsten-silicon-nitride (WSiN).

The actual machine that was used in depositing the antireflection coatings in accordance with the invention was a machine known as the MRC 943 sputtering machine which is commercially available from Materials Research Corporation, Orangeburg, N.Y. Valves, schematically designated in FIG. 5 as 34, were used to control the introduction of argon and nitrogen. The parameters for the deposition of various WSiN are given on Table I; for comparison purposes, parameters for deposition of a $WSi_{0.45}$ film are also shown.

TABLE I

| | ARC Deposition Parameters | | | | | |
|---|---|---|---|---|---|---|
| Material | Target Composition | Power (KW) | Pressure (μm) | % Nitrogen Feed Gas | Rate A/Pass | Sample Speed (cm/min) |
| $WSi_{0.45}$ | 1:1 | 1.0 | 9.0 | 0.0 | 125 | 100 |
| WSiN-G | 1:1 | 1.0 | 25.0 | 20 | 100 | 200 |
| WSiN-HR | 1:1 | 0.3 | 25.0 | 20 | 100 | 100 |

The table gives parameters for two WSiN materials, one deposited at a high DC power and designated WSiN-G, and the other at a lower power and designated WSiN-HR. The "Target Composition" of Table I refers to the ratio of tungsten to silicon in the tungsten silicide target. The "Pressure" in microns of mercury refers to the total gas pressure in the reactor. The "% of Nitrogen" refers to the percent portion of the total gas input that was nitrogen. With the MRC 943 sputtering machine, the substrate was moved transversely to the gas plasma during deposition; the "Rate" refers to the number of angstrom units of material that was deposited with each transversal or "pass" of the substrate through the plasma. The "Sample Speed" refers to the speed in centimeters per minute of the substrate through the plasma.

Figure 6:
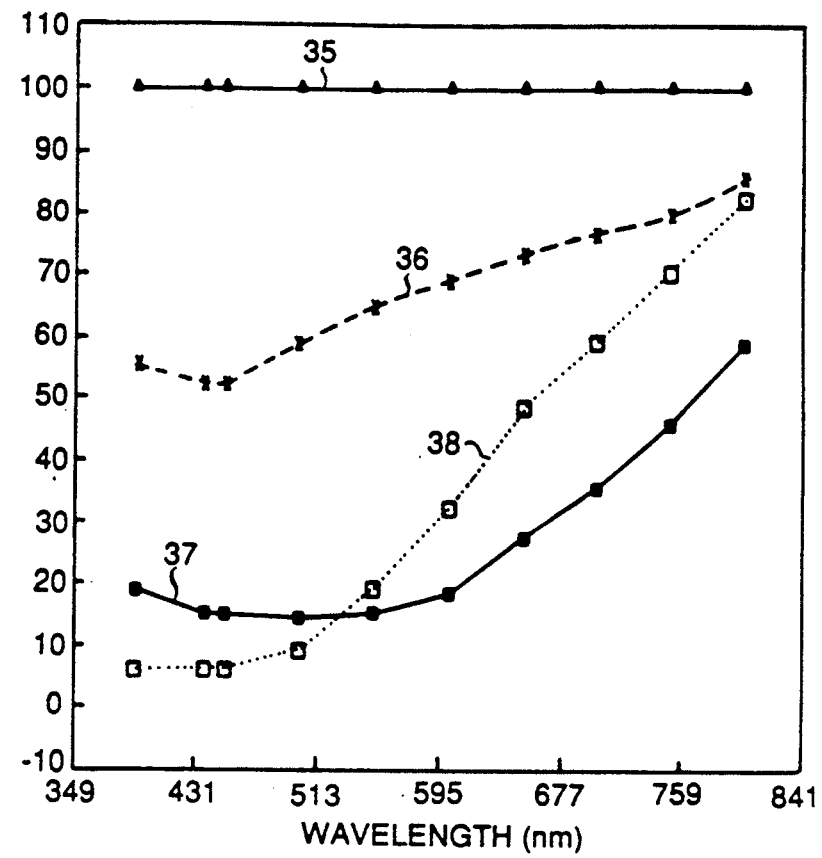
FIG. 6 is a graph of relative reflectivity versus wavelength for various antireflection coatings made in accordance with the invention.

FIG. 6 is a graph of relative reflectivity of different coatings made with the deposition parameters of Table I versus wavelength in nanometers. The relative reflectivity is in terms of the reflectivity with respect to that of aluminum. In other words, the reflectivity of aluminum is taken as being 100%, as is illustrated by curve 35. For purposes of comparison, curve 36 shows the relative reflectivity of $WSi_{0.45}$ made using the deposition parameters of Table I and coated to a thickness of 250 angstroms. One can see that the reflectivity of this film is between 50 and 70 percent of that of aluminum, thus providing a antireflection benefit. Curve 37 shows the relative reflectivity of WSiN-G at a thickness of 300 angstroms. One can see that this offers significantly improved antireflection benefits over that of curve 36. Curve 38 shows the relative reflectivity of WSiN-HR at a thickness of 300 angstroms; it has a reflectivity of only about 6% that of aluminum over a significant wavelength range.

Figure 7:
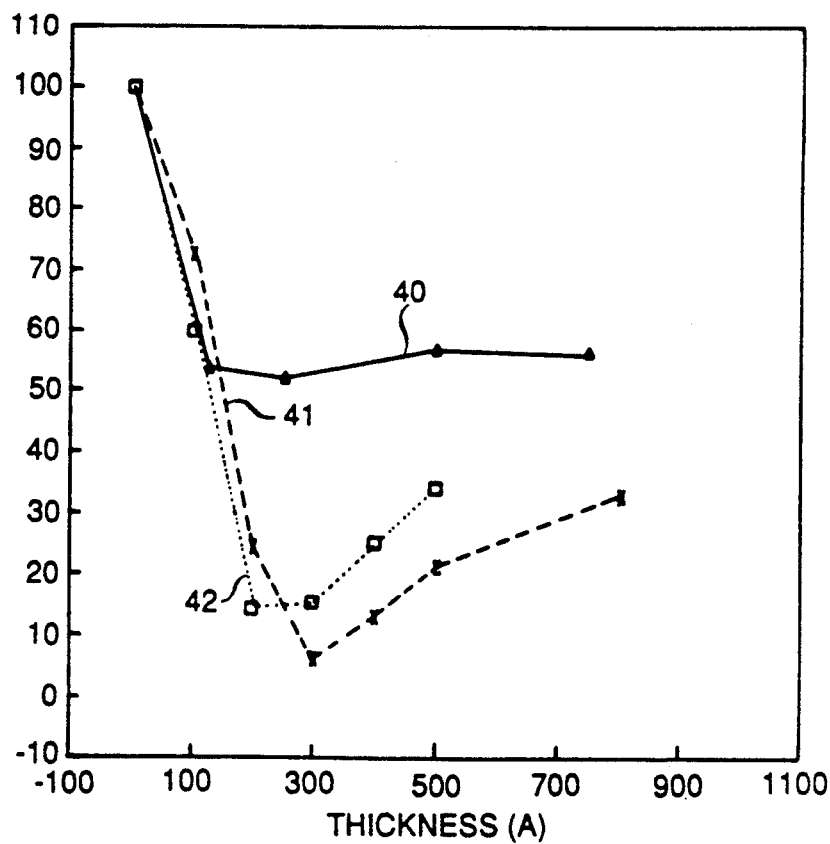
FIG. 7 is a graph of relative reflectivity at 436 nanometers wavelength versus coating thickness for various antireflection coatings made in accordance with the invention.

FIG. 7 shows the variation of relative reflectivity at a wavelength equal to 436 nanometers with respect to film thickness (in Angstrom units) for the three antireflection coatings. Curve 40 is the curve for $WSi_{0.45}$, curve 41 illustrates values for WSiN-HR and curve 42 illustrates reflectivity variations for WSiN-G. One can see that in general, the thickness of the antireflection coating for optimum antireflection benefits is between 125 and 750 angstroms. This illustrates that antireflection coatings made in accordance with the invention are not greatly thickness-dependent.

FIGS. 6 and 7 show that antireflection coatings of $WSi_{0.45}$ give benefits but that much greater benefits in terms of lower relative reflectivity are obtained from WSiN. FIG. 7 shows that significant benefits are obtained over a fairly wide range of thicknesses which indicates that extreme care in depositing the proper thickness need not be made.

The film designated WSiN-G is made by a method which we also use in gallium arsenide integrated circuit production for making WSi gate electrodes for field effect transistor components of the integrated circuits, except that the pressure (25 microns) is higher and the process uses nitrogen which is not used in the gate process. The good antireflection results of this embodiment as indicated by curve 37 of FIG. 6 and curve 42 of FIG. 7 show that in such an integrated circuit process, the same equipment and nearly the same parameters can be used for making the antireflection coating as are used for making the gate electrode, thereby avoiding the need for separate coating apparatus for making the antireflection coating. The parameters for WSiN-HR differ significantly from those for WSiN-G and yet the antireflection properties are also very beneficial. This indicates that careful control of the parameters of the sputtering process is not critical in order to get good antireflection benefits. All of the above considerations point to the fact that the antireflection coating process is a "robust" process step in the making of integrated circuits. All of the coatings have been tested and show good stress characteristics at the interface of aluminum which indicates good long term adhesion to aluminum.

Films were also deposited of tantalum-silicon-nitride (TaSiN) and titanium-silicon-nitride (TiSiN), but using somewhat different apparatus than that depicted in FIG. 5. The machine that was used is known as the MRC 8667 sputtering machine, which is available from the Materials Research Corporation. Separate targets were used for the metal and for the silicon. The metal target was operated in a DC magnetron mode while the silicon target was operated in a RF magnetron mode. The samples were rotated under the two targets which deposited the materials in very thin layers. The deposition parameters are given in Table II.

TABLE II

| Material | Metal/Si Ratio | Power (KW) | Pressure ($\mu$m) | % Nitrogen Feed Gas | Sample Movement (rev/min) |
|---|---|---|---|---|---|
| TaSiN | 1.5 | .75–1.25 | 10.0 | 75 | 3 |
| TiSiN | 1.5 | 1–1.25 | 10.0 | 75 | 3 |
| Si | | .759–1.25 | 10.0 | 0 | 3 |

The sample movement is given in revolutions per minute rather than centimeters per minute because of the nature of the sputtering apparatus that was used. Also, since separate targets were used, the metal/silicon ratio is given rather than the target composition ratio. For comparison purposes, an antireflection coating of pure amorphous silicon was also used, and the parameters for that coating are likewise given.

Figure 8:
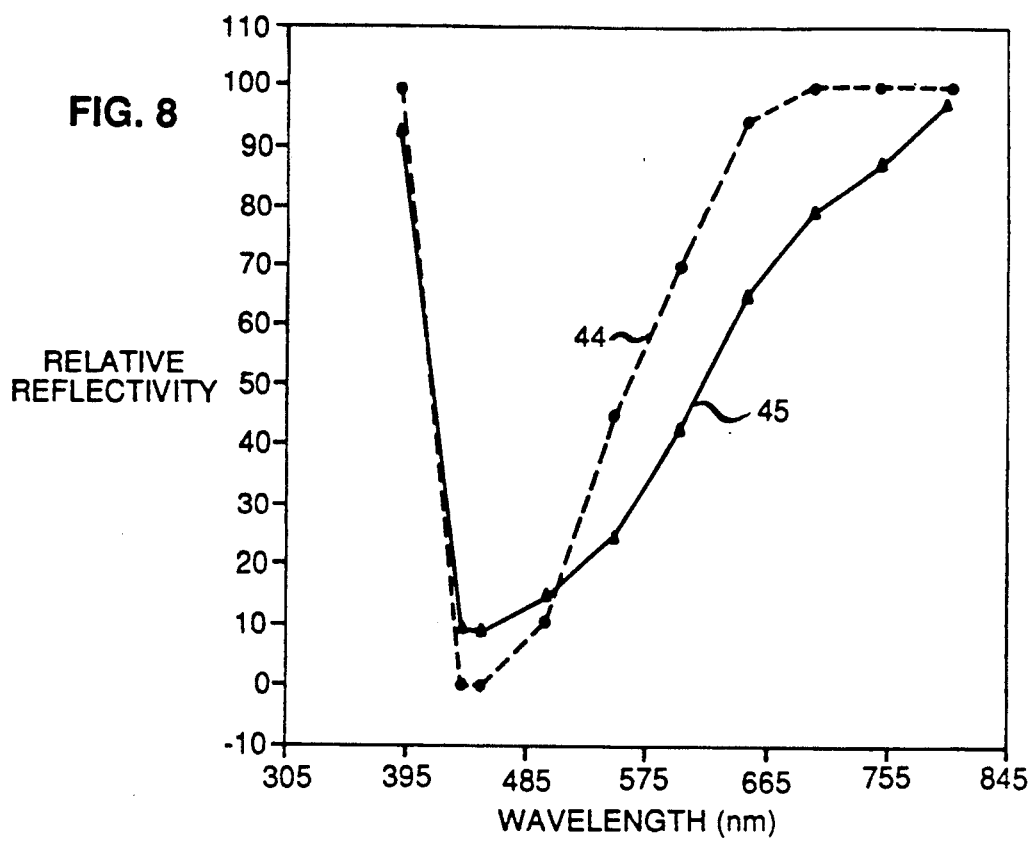
FIG. 8 is a graph of relative reflectivity versus wavelength for various other antireflection coatings made in accordance with the invention.
Figure 9:
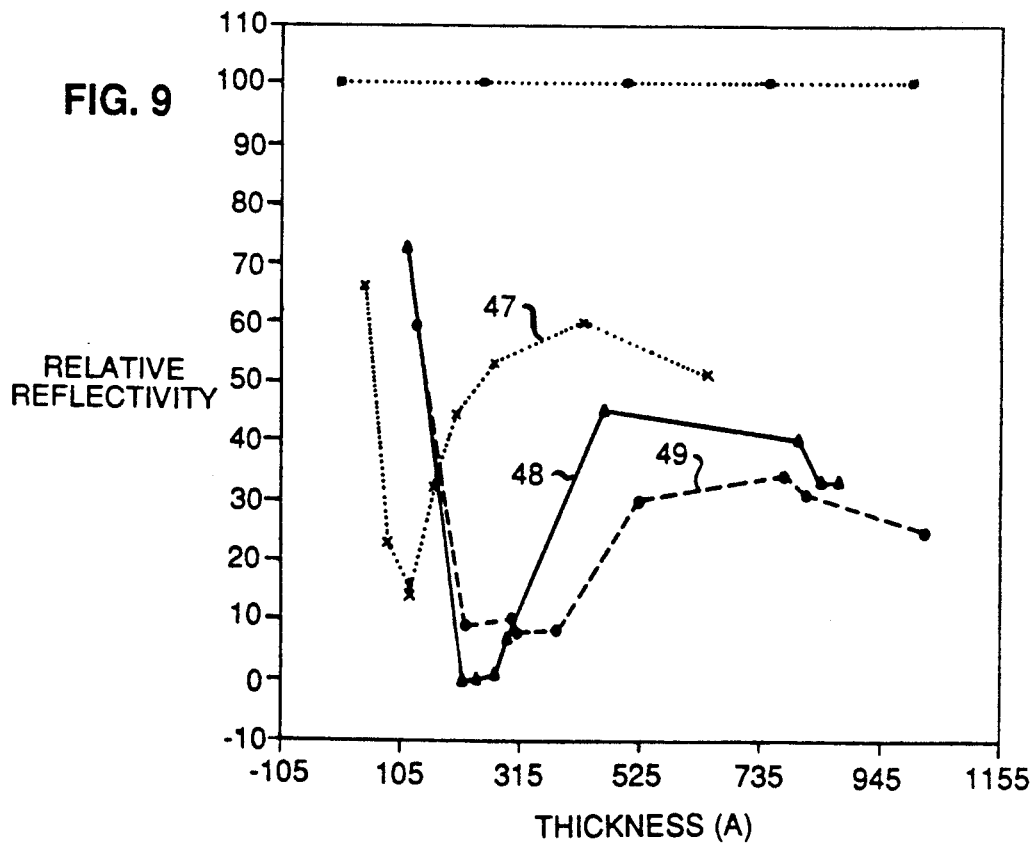
FIG. 9 is a graph of relative reflectivity versus coating thickness for various antireflection coatings.

FIG. 8 shows a curve 44 of the relative reflectivity versus wavelength of a coating of tantalum-silicon-nitride, while curve 45 shows the variation of relative reflectivity versus wavelength for titanium-silicon-nitride. In both cases, the thickness of the film was 225 angstroms. One can see that there is a very high absorption in the wavelength region of about 400–500 nanometers of wavelength. FIG. 9 shows the relative reflectivity versus film thickness at a wavelength of 436 nanometers. Curve 47 is for a film of pure silicon, 48 is a film of tantalum-silicon-nitride and curve 49 is for a film of titanium-silicon-nitride. One can see that the tantalum-silicon-nitride and titanium-silicon-nitride coatings have a significantly lower relative reflectivity than that of the amorphous silicon, and they work particularly well at thicknesses of between 200 and 350 angstroms.

Titanium, tantalum and tungsten are all members of a group of metals known as refractory metals. Titanium is taken from group IV of the periodic table, tantalum from group V and tungsten from group VI. With this sampling, we can state with assurance that any refractory metal which has been reacted with silicon and nitrogen to form a metal-silicide-nitride will work well as an antireflection coating and have many of the properties described above. Thus, the invention embraces the use of x-silicon-nitride, where x is a metal taken from the group consisting of titanium, vanadium, chromium, zirconium, niobium, molybdenum, hafnium, tantalum and tungsten.

It is known that aluminum is reactive with various semiconductor materials including silicon and is susceptible to a form of deterioration known as electromigration. Referring to FIG. 4, we have found that antireflection coatings 21 made in accordance with the invention also serve as very good protective layers for aluminum conductors 13. They adhere well, prevent electromigration, maintain their properties under conditions of subsequent integrated circuit processing, and they can also serve as protective layers during the long term use of the devices as integrated circuits. Another advantage is that reactive ion etching equipment, which is commonly used for etching the aluminum layer 13, also easily can be used to etch antireflection coating 21 made in accordance with the invention. Still another advantage is that, like the dielectric materials, antireflection coatings made in accordance with the invention can be etched in a $CF_4$ plasma; it may be useful to remove the antireflection coating along with the dielectric in a common plasma to insure good electrical contact to an underlying aluminum layer. For the sake of brevity, these subsidiary processing steps in which the antireflection coating finds utility will not be reviewed.

The invention was made in the course of the development of gallium arsenide integrated circuit processes using aluminum conductors and the advantages of the invention in such a context have been described. We believe the invention could be used to reduce reflection by other metals such as gold, copper, tantalum and tungsten, which are used in circuit processing, and also as an antireflection coating for bare silicon. The invention appears to be consistent with processes for making integrated circuits from other semiconductor materials such as silicon, indium phosphide and others, for making individual devices such as lasers from semiconductor substrates and for making printed circuits. The various ARC films can be made by co-sputtering from separate refractory metal and silicon targets. Also, they can be made by alternately sputtering from separate metal and silicon targets; if each layer is sufficiently thin, e.g., less than fifty angstroms, there will be a complete reaction of contiguous layers to form metal-silicon-nitride.

Visible light constitutes only one band of the electromagnetic spectrum, and it is to be understood that electromagnetic waves other than visible light such as ultraviolet light may be used to selectively expose the photoresist or other radiation-sensitive material. Various other embodiments and modifications of the invention will be apparent to those skilled from the art without departing from the spirit and scope of the invention.

We claim:

1. A photolithographic method for making a pattern over a reflective surface comprising the steps of: covering a reflective surface of a substrate with an antireflection coating; covering the antireflection coating with a radiation-sensitive material; selectively exposing the radiation-sensitive material to electromagnetic radiation by directing electromagnetic radiation through a patterned mask onto selected regions of the radiation-sensitive material to form a pattern; selectively removing the radiation-sensitive material in accordance with said pattern, thereby to form a patterned mask, characterized in that:

the antireflection coating is a composition containing x-silicon-nitride, where x is a metal taken from the group consisting of titanium, vanadium, chromium, zirconium, niobium, molybdenum, hafnium, tantalum and tungsten.

2. The method of claim 1 further characterized in that:

the antireflection coating is made by sputtering.

3. The method of claim 2 further characterized in that:

the reflective surface of the substrate comprises a coating of aluminum.

4. The method of claim 3 further characterized in that:

the mask is used as a pattern for selectively etching the aluminum and antireflection coatings.

5. The method of claim 4 further characterized in that:

the sputtering is done in an atmosphere containing nitrogen and the antireflection coating is a composition containing tungsten, silicon and nitrogen.

6. The method of claim 1 further characterized in that:

the antireflection coating is a composition containing tungsten-silicon-nitride.

7. The method of claim 1 further characterized in that:

the antireflection coating is a composition containing titanium-silicon-nitride.

8. The method of claim 1 further characterized in that:

the antireflection coating is a composition containing tantalum-silicon-nitride.

9. The method of claim 2 further characterized in that:

the sputtering step uses a single target comprising tungsten and silicon; and the antireflection coating has a thickness of 125-750 angstrom units.

10. The method of claim 2 further characterized in that:

the sputtering step uses two targets, one comprising silicon and the other target comprising a metal taken from the group consisting of tatanium, vanadium, chromium, zirconium, niobium, molybdenum, hafnium, tantalum and tungsten.

11. A method for making an integrated circuit comprising the steps of:

forming over a semiconductor layer a dielectric layer;

forming over the dielectric layer a metal layer;

forming over the metal layer an antireflection coating of x-silicon-nitride, where x is a metal taken from the group consisting of titanium, vanadium, chromium, zirconium, niobium, molybdenum, hafnium, tantalum and tungsten;

covering the antireflection coating with a layer of photoresist material;

selectively exposing the photoresist material to light by directing light through a patterned mask onto selected regions of the photoresist material to form a pattern;

selectively removing the photoresist material in accordance with said pattern thereby to form a patterned mask of the remaining photoresist material;

and using the patterned mask to selectively etch exposed regions of the antireflection coating and the metal layer, thereby to form a conductive pattern of the metal layer overlying the dielectric layer.

12. The method of claim 11 wherein:

the antireflection layer is made by first locating the metal layer in a sputtering reactor having targets of silicon and of the material x;

establishing between the metal layer and the target a low-pressure atmosphere including nitrogen;

ionizing the atmosphere with sufficient energy to create a plasma between the metal layer and the target and to cause particles to be sputtered from the targets onto the metal layer through the plasma so as to create the x-silicon-nitride coating on the metal layer.

13. The method of claim 12 wherein:

the metal layer consists of aluminum.

14. The method of claim 13 wherein:

the antireflection coating has thickness of 125-750 angstrom units.

15. The method of claim 14 wherein:

the x-silicon-nitride has the formula TiSiN.

16. The method of claim 14 wherein:

the x-silicon-nitride has the formula TaSiN.

17. A method for making an integrated circuit comprising the steps of:

forming over a semiconductor layer a dielectric layer;

forming over the dielectric layer a metal layer;

forming over the metal layer an antireflection coating of tungsten-silicon-nitride;

covering the antireflection coating with a layer of photoresist material;

selectively exposing the photoresist material to light by directing light through a patterned mask onto selected regions of the photoresist material to form a pattern;

selectively removing the photoresist material in accordance with said pattern, thereby to form a patterned mask of the remaining photoresist material;

and using the patterned mask to selectively etch exposed regions of the antireflection coating and the metal layer, thereby to form a conductive pattern of the metal layer overlying the dielectric layer.

18. The method of claim 17 wherein:

the antireflection layer is made by first locating the metal layer in a sputtering reactor having a target of tungsten and silicon;

establishing between the metal layer and the target a low-pressure atmosphere including nitrogen;

ionizing the atmosphere with sufficient energy to create a plasma between the metal layer and the target and to cause particles to be sputtered from the target onto the metal layer through the plasma so as to create a tungsten-silicon-nitride coating on the metal layer.

19. The method of claim 18 wherein:

the metal layer consists of aluminum.

20. The method of claim 19 wherein:

the antireflection coating has a thickness of 125-750 angstrom units.

21. The method of claim 18 wherein:

the tungsten-silicon-nitride has the formula WSiN.

* * * * *